United States Patent
Tsai et al.

(10) Patent No.: US 12,325,054 B2
(45) Date of Patent: Jun. 10, 2025

(54) MONITOR WAFER AND METHOD OF USING THE SAME

(71) Applicant: UNITED MICROELECTRONICS CORP., Hsinchu (TW)

(72) Inventors: Chih-Chieh Tsai, Kaohsiung (TW); Yi-Wei Chen, Taichung (TW)

(73) Assignee: UNITED MICROELECTRONICS CORP, Hsinchu (TW)

( * ) Notice: Subject to any disclaimer, the term of this patent is extended or adjusted under 35 U.S.C. 154(b) by 0 days.

(21) Appl. No.: 18/123,522

(22) Filed: Mar. 20, 2023

(65) Prior Publication Data
US 2024/0238852 A1   Jul. 18, 2024

(30) Foreign Application Priority Data

Jan. 13, 2023   (CN) .......................... 202310065276.7

(51) Int. Cl.
| | |
|---|---|
| B08B 7/00 | (2006.01) |
| H01L 21/67 | (2006.01) |
| H01L 23/29 | (2006.01) |

(52) U.S. Cl.
CPC .......... *B08B 7/0014* (2013.01); *B08B 7/0028* (2013.01); *H01L 21/67288* (2013.01); *H01L 23/293* (2013.01)

(58) Field of Classification Search
CPC ..................... B08B 7/0014; H01L 21/67288
See application file for complete search history.

(56) References Cited

U.S. PATENT DOCUMENTS

| | | | | |
|---|---|---|---|---|
| 5,671,119 | A * | 9/1997 | Huang ....................... | B08B 1/00 |
| | | | | 361/234 |
| 7,655,316 | B2 * | 2/2010 | Parkhe ....................... | B08B 1/00 |
| | | | | 428/458 |
| 9,721,783 | B2 * | 8/2017 | Cheng ................ | H01L 21/02096 |
| 11,333,984 | B2 * | 5/2022 | Bruls ................... | G03F 7/70925 |
| 2004/0169012 | A1 | 9/2004 | Carpenter | |
| 2008/0015802 | A1 * | 1/2008 | Urano ................ | G01N 21/9501 |
| | | | | 356/73 |

\* cited by examiner

*Primary Examiner* — Erin F Bergner
(74) *Attorney, Agent, or Firm* — WPAT, PC

(57) ABSTRACT

A monitor wafer is provided. The monitor wafer includes a substrate and a cleaning layer. The cleaning layer is disposed on a bottom surface of the substrate. The cleaning layer is configured to remove particles from the substrate and/or a processing tool.

5 Claims, 3 Drawing Sheets

100

100

MONITOR WAFER AND METHOD OF USING THE SAME

This application claims the benefit of People's Republic of China application Serial No. 202310065276.7, filed Jan. 13, 2023, the subject matter of which is incorporated herein by reference.

TECHNICAL FIELD

This disclosure relates to a monitor wafer and a method of using the same.

BACKGROUND

Particles may accumulate in a processing tool. For example, fall-on particles from the processing chamber of the processing tool and reaction byproduct residues from previous process may remain on a chuck. Such particles may contaminate the processes and/or lead to tool down or scrap, and thus should be removed. However, in order to remove the particles, the processing chamber must be opened and maintained. It is time consuming.

SUMMARY

This disclosure is focused on a time saving solution for the removal of the particles as described above.

This disclosure provides a monitor wafer. The monitor wafer comprises a substrate and a cleaning layer. The cleaning layer is disposed on a bottom surface of the substrate. The cleaning layer is configured to remove particles from the substrate and/or a processing tool.

This disclosure also provides a method of using a monitor wafer. The monitor wafer comprises a substrate and a cleaning layer, and the cleaning layer is disposed on a bottom surface of the substrate. The method comprises following steps. First, the monitor wafer is transported into a processing tool. Then, a tool particle condition of the processing tool is monitored using the substrate of the monitor wafer. Particles are removed from the substrate and/or the processing tool using the cleaning layer of the monitor wafer. Monitoring the tool particle condition and removing the particles are conducted concurrently.

In this disclosure, a monitor wafer having a cleaning layer is used. As such, the particles can be removed when the regular monitor is conducted. The additional time required for the removal of the particles can thus be reduced significantly.

Figure 1A:
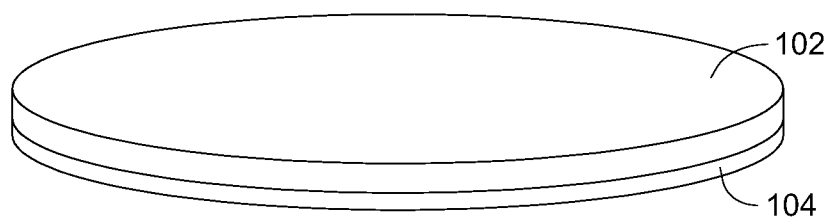
FIGS. 1A-1B show an exemplary monitor wafer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The description and the drawings are provided for illustrative only, and should not result in a limitation. For clarity, the elements may not be drawn to scale. In addition, some elements and/or reference numerals may be omitted from some drawings. It is contemplated that the elements and features of one embodiment can be beneficially incorporated in another embodiment without further recitation.

Figure 1B:
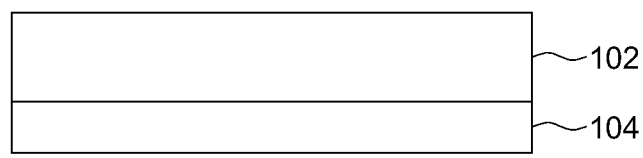

One aspect of the disclosure is directed to a monitor wafer. Referring to FIGS. 1A-1B, an exemplary monitor wafer 100 is shown, wherein FIG. 1A is a perspective view of the monitor wafer 100, and FIG. 1B is a cross sectional view of the monitor wafer 100. The monitor wafer 100 comprises a substrate 102 and a cleaning layer 104. The cleaning layer 104 is disposed on a bottom surface of the substrate 102. The cleaning layer 104 is configured to remove particles from the substrate 102 and/or a processing tool.

Specifically, the substrate 102 is a main portion for providing a monitoring function to the monitor wafer 100. The substrate 102 can comprise Si. Other details of the substrate 102 can be similar to those of the monitor wafers typically used in semiconductor processes, and will not be repeated herein.

The cleaning layer 104 further provides a particle removing function to the monitor wafer 100. The cleaning layer 104 can use a material satisfying at least one of the following characteristics: (1) stable in a temperature range from −20° C. to 450° C.; (2) moisture proofing; and (3) acid resisting, alkali resisting, and/or solvent resisting. More preferably, the cleaning layer 104 uses a material satisfying all of the characteristics (1) to (3) as described above. For example, the cleaning layer 104 can comprise polyimide or polyimide-based material. The polyimide-based material can be, for example, bio-based polyimide, such as a recyclable polyimide-based nanofiltration membrane generated by polycondensation of highly flexible 4,4'-diamino-3,3'-dimethyldiphenyl methane and 3,3',4,4'-benzophenonetetracarboxylic dianhydride, but not limited thereto. Such a cleaning layer 104 can remove particles by a various mechanisms. For example, physical adhesion can be generated between the cleaning layer 104 and a chuck carrying the monitor wafer 100, and thereby actively take away visible large particles from the chuck. In addition, surface polymer of the cleaning layer 104 has polarity, and thus surface adsorption and/or van der Waals Force can be generated to actively take away small particles.

The cleaning layer 104 can be disposed on the whole bottom surface of the substrate 102. Herein, the term "top surface" is referred to a surface of the substrate 102 that is corresponding to a surface of a wafer to be treated in the processing tool, and the term "bottom surface" is referred to a surface opposite to the top surface. It is contemplated that, in the processing tool, the top surface of the monitor wafer typically faces a processing source, such as but not limited to a target, an etchant, a plasma source, a polishing machine, and so on. In some embodiments, the cleaning layer 104 has a thickness from 20 μm to 40 μm.

Figure 2A:
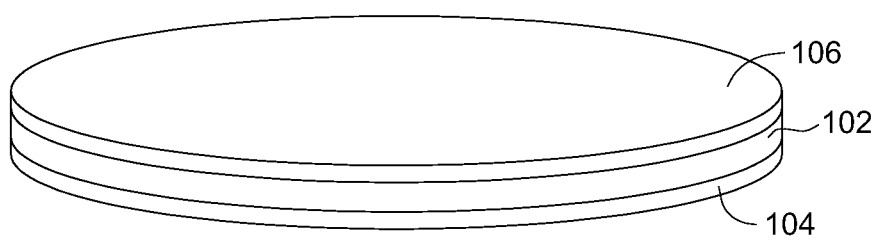
FIGS. 2A-2B show another exemplary monitor wafer.
Figure 2B:
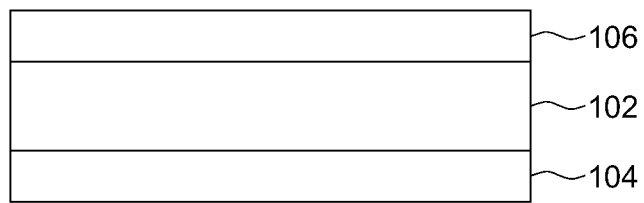

FIGS. 2A-2B show another exemplary monitor wafer 100', wherein FIG. 2A is a perspective view of the monitor wafer 100', and FIG. 2B is a cross sectional view of the monitor wafer 100'. The monitor wafer 100' is different from the monitor wafer 100 in that the monitor wafer 100' further comprises another cleaning layer 106 disposed on a top surface of the substrate 102. Similar to the cleaning layer 104, the cleaning layer 106 can be disposed on the whole top surface of the substrate 102. Other details of the cleaning layer 106 are similar to those of the cleaning layer 104, and will not be repeated herein.

Another aspect of the disclosure is directed to a method of using a monitor wafer. The monitor wafer can be the monitor wafer 100 or the monitor wafer 100' as described above. The monitor wafer can comprise a substrate 102 and a cleaning layer 104 disposed on a bottom surface of the substrate 102. The substrate 102 can comprise Si. The cleaning layer 104 can comprise polyimide or polyimide-based material. The cleaning layer 104 can be disposed on the whole bottom surface of the substrate 102. The monitor wafer 100' may also be used, and it comprises another cleaning layer 106 disposed on a top surface of the substrate 102. Other details of the monitor wafer will not be repeated herein.

Figure 3:
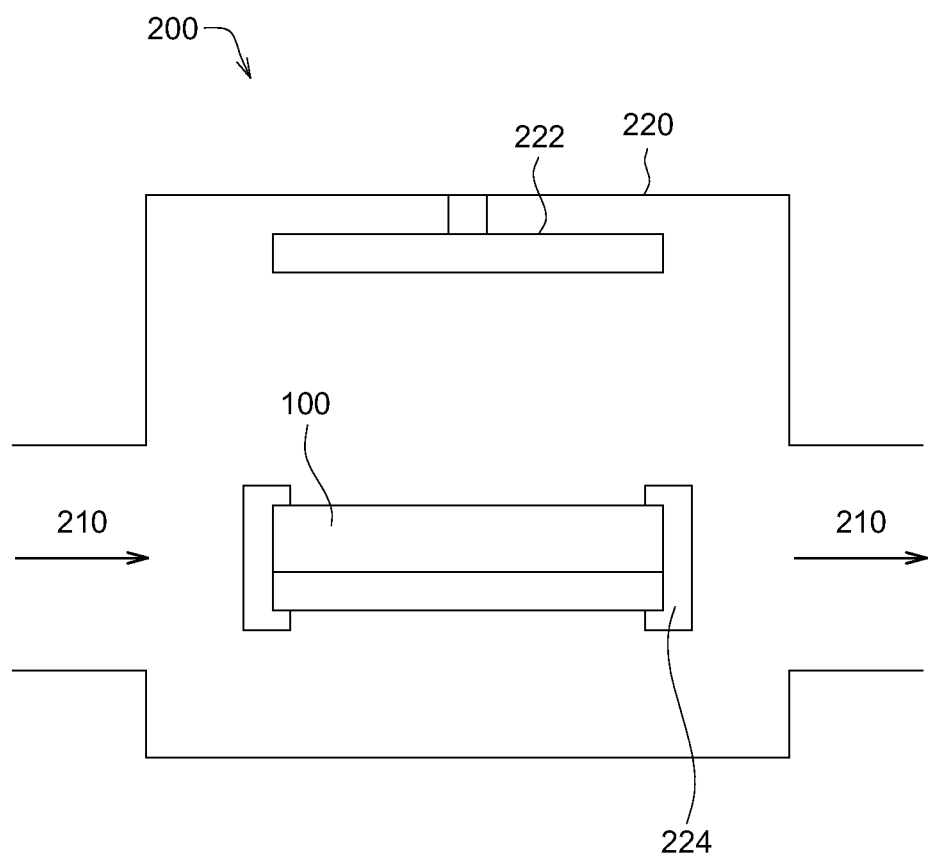
FIG. 3 shows the use of an exemplary monitor wafer.

For convenience, the following illustration will use the monitor wafer 100 as an example. Referring to FIG. 3, the method comprises following steps. First, the monitor wafer 100 is transported into a processing tool 200. Then, a tool particle condition of the processing tool 200 is monitored using the substrate 102 of the monitor wafer 100. Particles are removed from the substrate 102 and/or the processing tool 200 using the cleaning layer 104 of the monitor wafer 100. Monitoring the tool particle condition and removing the particles are conducted concurrently.

More specifically, the processing tool 200 can comprise a processing path 210 as indicated by arrows and a processing chamber 220. The processing chamber 220 comprises, for example, a processing source 222 and a chuck 224. The processing source 222 can be but not limited to a target, an etchant, a plasma source, a polishing machine, and so on. The chuck 224 can be a magnetic chuck or a vacuum chuck. It should be understood that the details of the processing tool 200 described herein and shown in FIG. 3 are for illustrative only, and should not result in a limitation.

Transporting the monitor wafer 100 into the processing tool 200 can be transporting the monitor wafer 100 into the processing chamber 220 of the processing tool 200 along the processing path 210 of processing tool 200.

In a condition that the processing tool 200 comprises the processing path 210 and the processing chamber 220, monitoring the tool particle condition of the processing tool 200 can comprise monitoring a particle condition of the processing path 210 and a particle condition of the processing chamber 220. The tool particle condition, as well as the particle condition of the processing path 210 and the particle condition of the processing chamber 220, can comprise a particle type, a particle amount, and a particle distribution. The particles are, for example, fall-on particles from the processing chamber and/or reaction byproduct residues remained on the chuck from previous process, but not limited thereto.

In some embodiments, the method can further comprise monitoring defects of the monitor wafer 100 and/or the processing tool 200 other than the particles using a defect scanning tool.

In removing the particles from the processing tool 200 and/or the substrate 102, the cleaning layer can remove particles by at least one of adhesion, adsorption, or van der Waals Force. In some embodiments, removing the particles can comprise applying an energy to the cleaning layer 104. The additional energy may be beneficial for increasing the adsorption effect of the cleaning layer 104.

In summary, various mechanisms such as adhesion, adsorption, van der Waals Force, and so on are used in the disclosure to remove particles when the regular monitor is conducted. As such, the additional time required for the removal of the particles can be reduced significantly. It is estimated that, compared to removing particles by opening and maintaining the process chamber, using the monitor wafer according to the disclosure to remove particles can save about 19.5 days of idle time per year. It is beneficial for extending PM (preventive maintenance) cycle and increasing up-time.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A monitor wafer, comprising:
   a substrate; and
   a cleaning layer disposed on a bottom surface of the substrate, the cleaning layer configured to remove particles from a processing tool and/or the substrate;
   wherein the substrate is configured for providing a monitoring function to a tool particle condition of the processing tool; and
   wherein the cleaning layer comprises a recyclable polyimide-based nanofiltration membrane generated by polycondensation of highly flexible 4,4'-diamino-3,3'-dimethyldiphenyl methane and 3,3',4,4'-benzophenonetetracarboxylic dianhydride.

2. The monitor wafer according to claim 1, wherein the substrate comprises Si.

3. The monitor wafer according to claim 1, wherein the cleaning layer has a thickness from 20 μm to 40 μm.

4. The monitor wafer according to claim 1, wherein the cleaning layer is disposed on the whole bottom surface of the substrate.

5. The monitor wafer according to claim 1, further comprising:
   another cleaning layer disposed on a top surface of the substrate.

* * * * *